United States Patent [19]

Katsuoka et al.

[11] Patent Number: 4,918,520

[45] Date of Patent: Apr. 17, 1990

[54] DEVICE FOR DETECTING THE POSITION OF CRYSTALLIZATION INTERFACE

[75] Inventors: Nobuo Katsuoka, Takasaki; Masahiko Nigorikawa, Takehu; Shuji Ohmori, Annaka, all of Japan

[73] Assignee: Shin-Etu Handotai Company, Limited, Tokyo, Japan

[21] Appl. No.: 185,894

[22] Filed: Apr. 25, 1988

[30] Foreign Application Priority Data

Apr. 27, 1987 [JP] Japan .................................. 62-104084

[51] Int. Cl.⁴ .............................................. H04N 7/18
[52] U.S. Cl. ..................................... 358/93; 358/107; 358/101; 156/601
[58] Field of Search ......................... 358/101, 93, 107; 156/601

[56] References Cited

U.S. PATENT DOCUMENTS

| | | | |
|---|---|---|---|
| 3,617,631 | 11/1971 | Soames | 358/93 X |
| 3,835,247 | 9/1974 | Soames | 358/93 X |
| 4,242,589 | 12/1980 | Sachs | 358/101 X |
| 4,277,441 | 7/1981 | Sachs | 156/601 X |
| 4,565,598 | 1/1986 | Seymour | 156/601 |

FOREIGN PATENT DOCUMENTS

| | | |
|---|---|---|
| 1166842 | 8/1984 | Canada . |
| 3325003 | 7/1983 | Fed. Rep. of Germany . |
| 986943 | 3/1965 | United Kingdom . |

OTHER PUBLICATIONS

Patent Abtracts of Japan, vol. 8, No. 211, p. 303 [1648], Sep. 1984; & JP-A-59 94 006, Hitachi Seisakusho K.K., May 30, 1984.

Computer Design, vol. 21, No. 8, Aug. 1982, p. 24, Winchester, Mass., J. Aseo; "Machine vision system inspects 100% of manufactured parts".

*Primary Examiner*—James J. Groody
*Assistant Examiner*—Victor R. Kostak
*Attorney, Agent, or Firm*—Browdy and Neimark

[57] ABSTRACT

A device for use in a monocrystal producing apparatus based on the FZ method and designed to detect a crystallization interface (20) between a melt (16) and a monocrystalline rod (12) even if the luminous line of the crystallization interface is partly curved downward. This device samples a series of luminance signals from the side of the melt to the side of the monocrystalline rod along a sensing line intersecting the crystallization interface, thereby successively outputs a series of sampled luminance signals (Sj), determines a value as a reference level (S₀) relative to this specific level of the luminance signals, e.g., a peak value thereof, and discriminates the crystallization interface when one of the series of sampled luminance signals exceeds the reference level. A pixel position corresponding to this discrimination is determined as a pixel position corresponding to the crystallization interface.

5 Claims, 6 Drawing Sheets

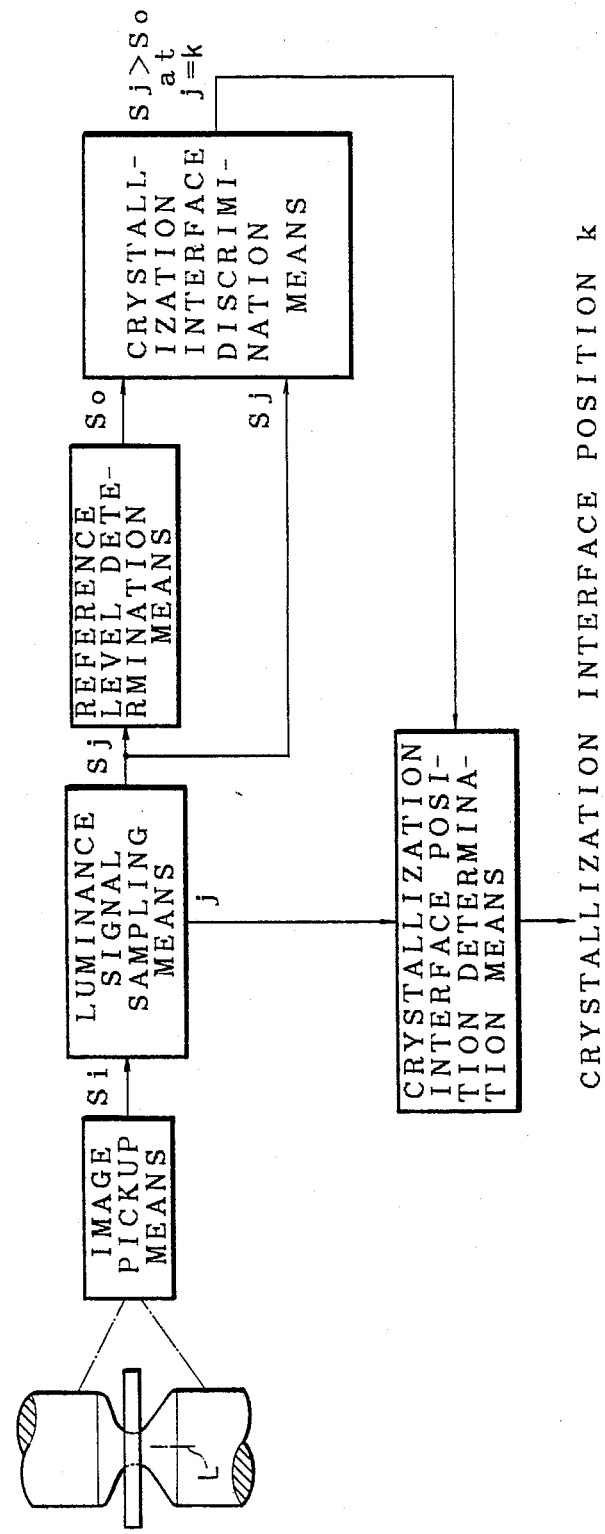
F I G. 1

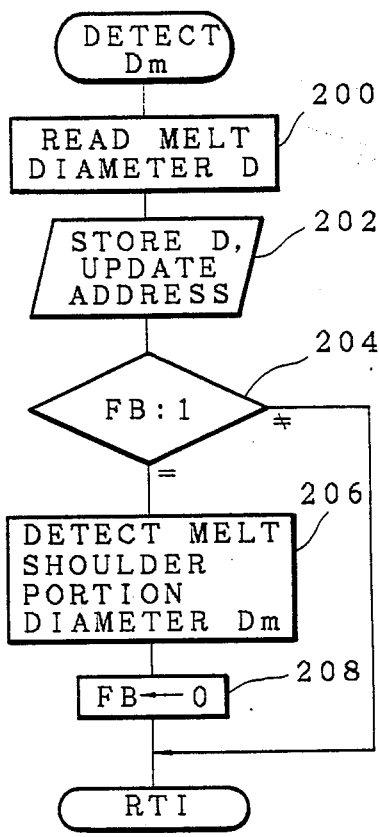
F I G. 4
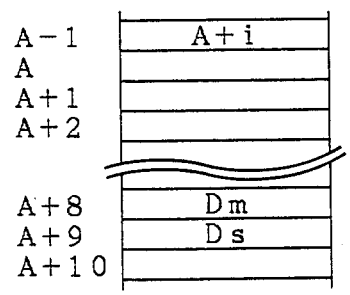
F I G. 5

DEVICE FOR DETECTING THE POSITION OF CRYSTALLIZATION INTERFACE

BACKGROUND OF THE INVENTION

1. Field of the Invention

This invention relates to a device for detecting the position of an interface between a melt and a monocrystalline rod. This device is used in a monocrystal producing apparatus based on the floating zone (hereinafter referred to as FZ) method.

2. Description of the Prior Art

In general, in a monocrystal producing apparatus based on the FZ method, such as that shown in FIG. 8, a floating zone 16 is formed by an induction heating coil 14 between a raw-material rod 10 and a monocrystalline rod 12 while these rods are relatively moved downward. In a conventional method of this type, a diameter Ds of the crystalline rod 20 at the crystallizing interface is detected by an industrial TV camera 18, and the apparatus is controlled by adjusting the detected diameter to a set value. The inventor of the present invention has found that a diameter Dm of a cross-section of a melt shoulder portion 21 at a predetermined distance from the cystallization interface 20 strongly correlates to the diameter Ds with a certain time interval. Also, this finding has enabled the control of the crystal diameter Ds at the crystallizing interface to be performed with improved response and stability. Specifically, in the process of forming a conical portion, it is possible to minimize the axial length while preventing spillover of the melt (U.S. application Ser. No. 07/132, 191, EP application No. 8711849.2).

In this method of controlling the diameter Dm of a melt shoulder portion, the value of the diameter Dm of a melt shoulder portion predicts the value of the diameter Ds of the crystal rod at the crystallizing interface to be obtained after a predetermined time period has passed, and the diameter Dm should be accurate enough to measure in order to precisely estimate the value of the diameter Ds. Beyond a critical value of the diameter Dm, which depends on the diameter Ds and the magnitude of the surface tension of the melt, the spilling of the melt over the crystal edge occurs, and the due control is therefore specially important in the conical portion zoning when the melt must bulge over the edge of the crystallizing lower portion.

In a conventional system, such as the one disclosed in Japanese Patent Publication No. 48424/1972, the floating zone 16 and portions thereabound are observed by an industrial TV camera 18, a luminance signal which represents the luminance along a sensing line L is obtained by scanning from the monocrystalline rod 12 to the floating zone 16, and a position at which the level of the luminance signal abruptly decreases is located as the position of the crystallization interface 20.

The level of this luminance signal ordinarily changes as indicated by the line (X) in FIG. 7. The arrow B in FIG. 7 indicates the direction of scanning in accordance with the conventional method.

However, crystal growth lines are formed on the side surface of the monocrystalline rod 12 in accordance with the crystallographic orientation, and the crystalline interface profile is inconsistently deformed downward at a position at which the crystal growth line intersects the crystallization interface 20, thereby forming a crystal growth curve 22. The luminance signal level thereby changes as indicated by the line (Y) in FIG. 7. There is therefore a possibility of an error occurring in determination of the position of the crystallization interface 20 by a distance d.

Thus, in this detection method, the error makes inevitably the positioning of a melt shoulder portion for measurement inaccurate, and it is therefore not possible to detect a necessary diameter Dm of a melt shoulder portion constantly and accurately.

SUMMARY OF THE INVENTION

In view of these problems, it is an object of the present invention to provide a device for detecting the position of a crystallization interface which is capable of accurately detecting the position of the crystallization interface even if the interface profile is inconsistently deformed downward due to crystal growth lines.

To this end, the present invention provides a device for detecting the position of a crystallization interface, the device having: an image-pickup means adapted to scan an area about a crystallization interface and output a luminance signal; a luminance signal sampling means adapted to sample the luminance signal from the side of a melt to the side of a monocrystalline rod along a sensing line intersecting the crystallization interface, thereby successively output a series of sampled luminance signals relating to the sensing line, and determine pixcel positions of the sampled luminance signals in correspondence with the sensing line; a reference level determination means adapted to set a value as a reference level relative to a specific level of the sampled luminance signals; a crystallization interface discrimination means adapted to locate the crystallization interface by comparing levels of the series of sampled luminance signals with the reference level and detecting a moment at which one of the levels of the sampled luminance signals exceeds the reference level; and a crystallization interface position determination means adapted to determine that one of the pixel positions corresponds to the crystallization interface.

The above specific level of the sampled luminance signals is, for example, a maximum peak value of the luminance signal, or a value of the luminance signal obtained at the sampling start point on the sensing line. The relative value means a value which is obtained by multiplying the specific level by a constant or adding a constant to the specific value, or by substituting the specific level for a variable of a predetermined function.

The sensing line is generally parallel to the growth axis of the monocrystalline rod. The starting point of the sensing line is distanced from a preliminarily detected position of the crystallization interface to the side of the melt to an extent corresponding to a predetermined number of horizontal scanning lines.

The luminance of a portion of the melt in the vicinity of the deformed interface profile 22 shown in FIG. 2 is lower than that at the contour line itself of the deformed interface profile 22, but the temperature of a melt portion distanced enough from the interface is substantially equal around the periphery of the melt portion since this melt portion is rotated in unison with the monocrystalline rod 12. Therefore, if the sensing line L passes across the deformed interface contour 22, the luminance signal level changes up to the position corresponding to the maximum peak value from the position corresponding to the major crystallization interface, as shown in FIG. 7.

However, since the luminance signal is read along the sensing line L from the side of the melt 16 to the side of the monocrystalline rod 12, and the reference value So is determined in the above-described manner, the position of the major crystallization interface 20 can be detected with accuracy irrespective of whether or not the deformed interface contour 22 exists.

It is thus possible to measure with consistent accuracy the diameter Dm of a melt shoulder portion distanced by a predetermined number of horizontal scanning lines from the crystallization interface, enabling at a crystallizing interface crystal diameter control to be performed desirably without any possibility of occurrence of melt spilling off.

BRIEF DESCRIPTION OF THE DRAWINGS

FIG. 1 is a block diagram showing how sampled luminance signals in the vicinity of the interface of the melt and the crystalline rod are processed to determine the crystallization interface in the present invention;

FIGS. 3 and 4 are flow charts of the software structure of a microcomputer of the device shown in FIG. 2;

FIG. 5 is a storage area for storing measured diameters;

DESCRIPTION OF THE PREFERRED EMBODIMENT

An embodiment of the present invention will be described below with reference to the accompanying drawings.

Figure 2:
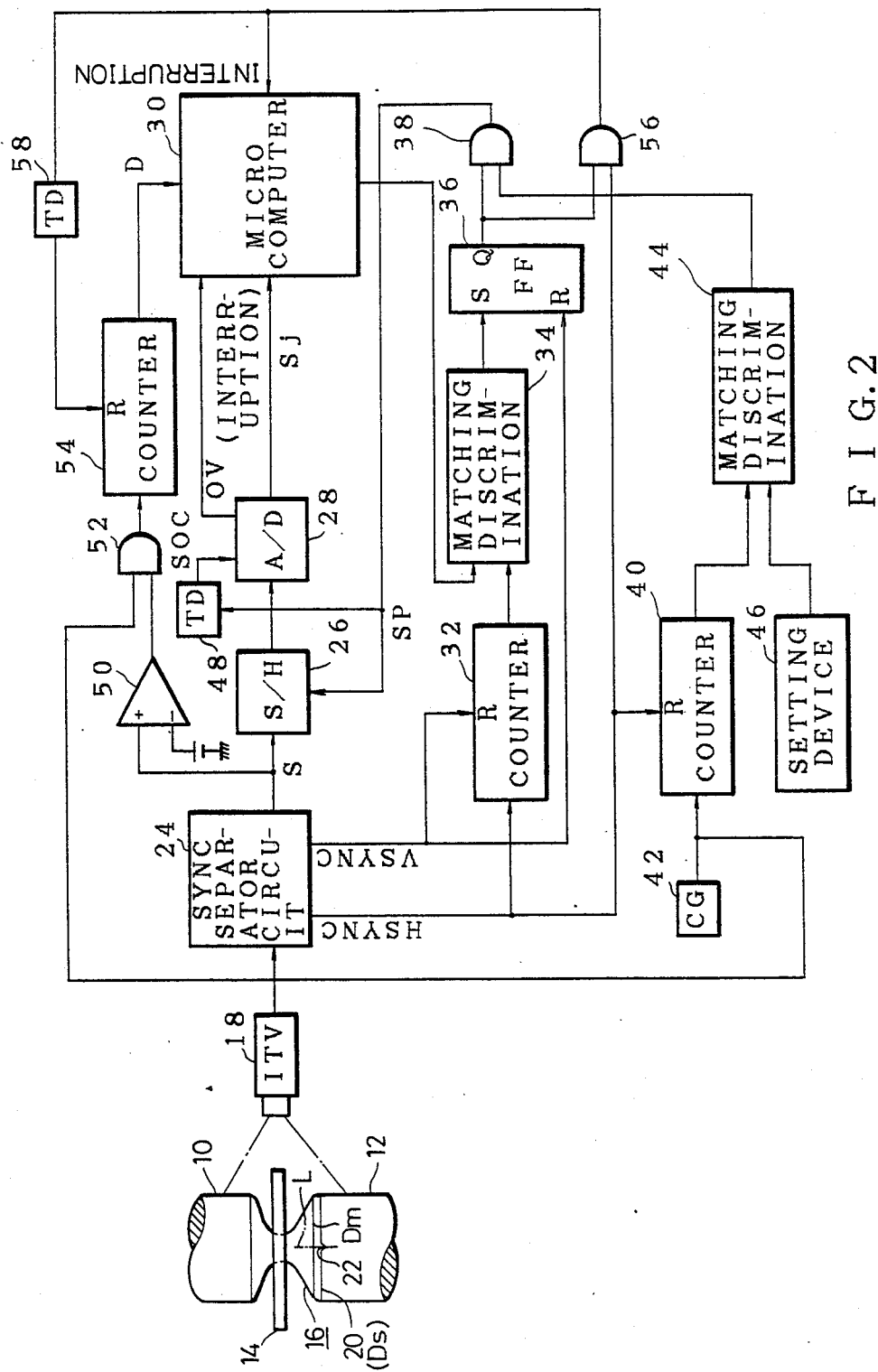
FIG. 2 is a block diagram of the hardware configuration of a device for detecting the position of a crystallization interface which represents an embodiment of the present invention.
Figure 8:
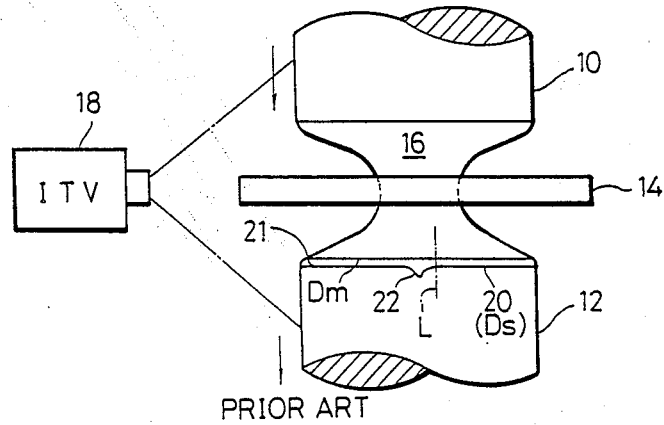
FIG. 8 is a side view of the neighborhood of the molten zone indicating essential elements thereof, which are quoted in the explanation of prior arts.

The hardware configuration of a device for detecting the position of a crystallization interface will first be described with reference to FIG. 2. Components which are identical to those shown in FIG. 8 are indicated by the same reference numerals.

A composite image signal is supplied from an industrial TV camera 18 to a sync separator circuit 24, and a horizontal synchronizing signal HSYNC, a vertical synchronizing signal VSYNC and a luminance signal S are separated respectively from the composite image signal. The luminance signal is periodically sampled by a sample and hold circuit 26 so as to hold values of the level of this signal. The values thereby sampled and held are supplied to an A/D converter 28, are then converted into digital values, and are read by a microcomputer 30, thereby detecting the position of a crystallization interface 20.

Figure 7:
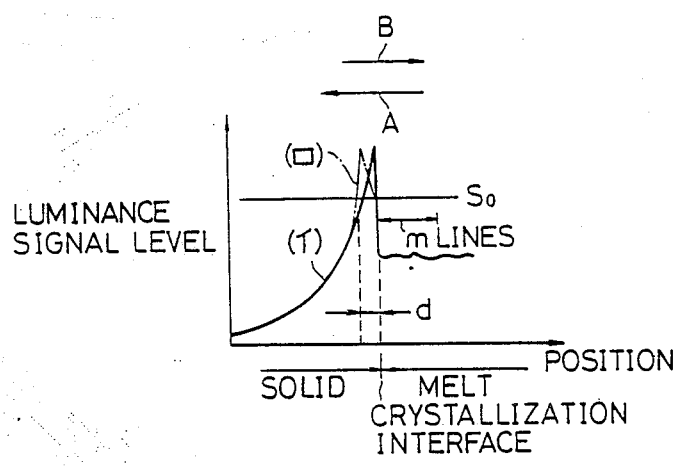
FIG. 7 is a graph with respect to the luminance signal level along a sensing line and to a reference level.

In this embodiment, as shown in FIG. 7, the position at which the sampling is started is set to a scanning line which is located m lines before the scanning line corresponding to the position of the crystallization interface 20 detected in the preceding step. The luminance signal is thereby sampled successively in the direction indicated by the arrow A. That is, in the embodiment shown in FIG. 2, after a counter 32 has been reset by the vertical synchronizing signal VSYNC, it counts the horizontal synchronizing signal HSYNC and supplies count values thereby obtained to a matching discrimination circuit 34. On the other hand, the microcomputer 30 supplies the matching discrimination circuit 34 with the number of scanning lines between an initial horizontal scanning position (uppermost stage) and the above-mentioned sampling start position. This value is latched until this circuit is reset. If this value matches the count value supplied from the counter 32, the matching discrimination circuit 34 supplies a match signal to a setting terminal of an RS flip flop 36. The output from the flip flop 36 thereby becomes a high level so that an AND gate 38 is opened.

Figure 6:
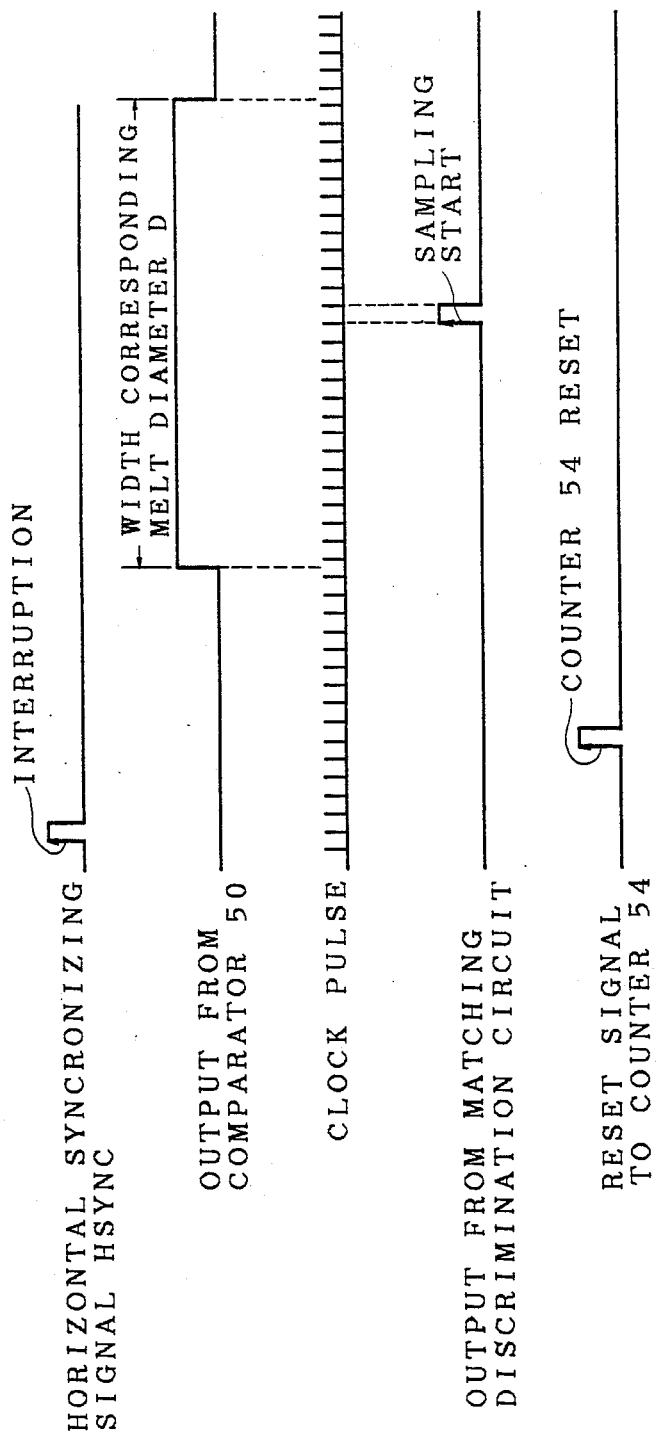
FIG. 6 is a waveform diagram of essential signals used in the hardware shown in FIG. 2.

The direction of the scanning lines is perpendicular to that of a sensing line L, and each scanning line intersects the sensing line L substantially at its center. The position of a picture element corresponding to a point on the sensing line L is detected as described below. That is, a count value counted by a counter 40 is reset by the front edge of the horizontal synchronizing signal HSYNC as shown in FIG. 6. The counter counts pixel clock supplied from a clock generator 42, and supplies count values thereby obtained to a matching discrimination circuit 44. At the same time, a certain constant value is supplied from a setting device 46 to the matching discrimination circuit 44. If the count value supplied from the counter 40 becomes equal to a value corresponding to a picture element related to a point on the sensing line L, a match signal is output from the matching discrimination circuit 44 (refer to FIG. 6), passes through the AND gate 38, and is supplied as a start pulse SP to a control terminal of the sample and hold circuit 26. A luminance signal S supplied from the sync separator circuit 24 is sampled by the front edge of the start pulse SP. The start pulse SP is supplied as a conversion start signal to the A/D converter 28 via a delay circuit 48, thereby starting the conversion of the luminance signal into a digital value. After this conversion has been completed, an output decision signal OV output from the A/D converter 28 is supplied as an interrupt signal to the microcomputer 30. This interruption starts the execution of a program which corresponds to the flow chart shown in FIG. 3, and the microcomputer 30 reads from the A/D converter 28 luminance data to be processed. The diameter of the floating zone 16 is measured during scanning as follows. That is, a luminance signal S output from the sync separator circuit 24 is supplied to a comparator 50 and is compared with the reference value, so that, as shown in FIG. 6, a pulse width which is in proportion to the diameter of the floating zone is output from a comparator 50, thereby opening the AND gate 52. At this time, a clock pulse output from the clock generator 42 passes through the AND gate 52, and is counted by a counter 54. The horizontal synchronizing signal HSYNC supplied from the sync separator circuit 24 passes through an AND gate 56 so that interruption is effected in the microcomputer 30. A program which corresponds to the flow chart shown in FIG. 4 is thereby executed, and the count value output from the counter 54 is read and processed by the microcomputer 30. The horizontal synchronizing signal HSYNC is also supplied to a resetting input terminal of the counter 54 via the delay circuit 58 (refer to FIG. 6) so that the count value in the counter 54 is reset after the process shown in FIG. 4 has been completed.

The software structure for the microcomputer 30 will be described below with reference to FIGS. 3 and 4.

To sum up, the microcomputer 30 reads luminance data $S_j$ from the A/D converter 28 and compares this data with a reference value $S_o$. If $S_j > S_o$, the corresponding pixel position is determined to be a position corresponding to the crystallization interface 20, a melt diameter D output from the counter 54 is used as a melt shoulder diameter Dm to control the diameter of a monocrystalline rod 12. Details of this process will be described below.

Figure 3:
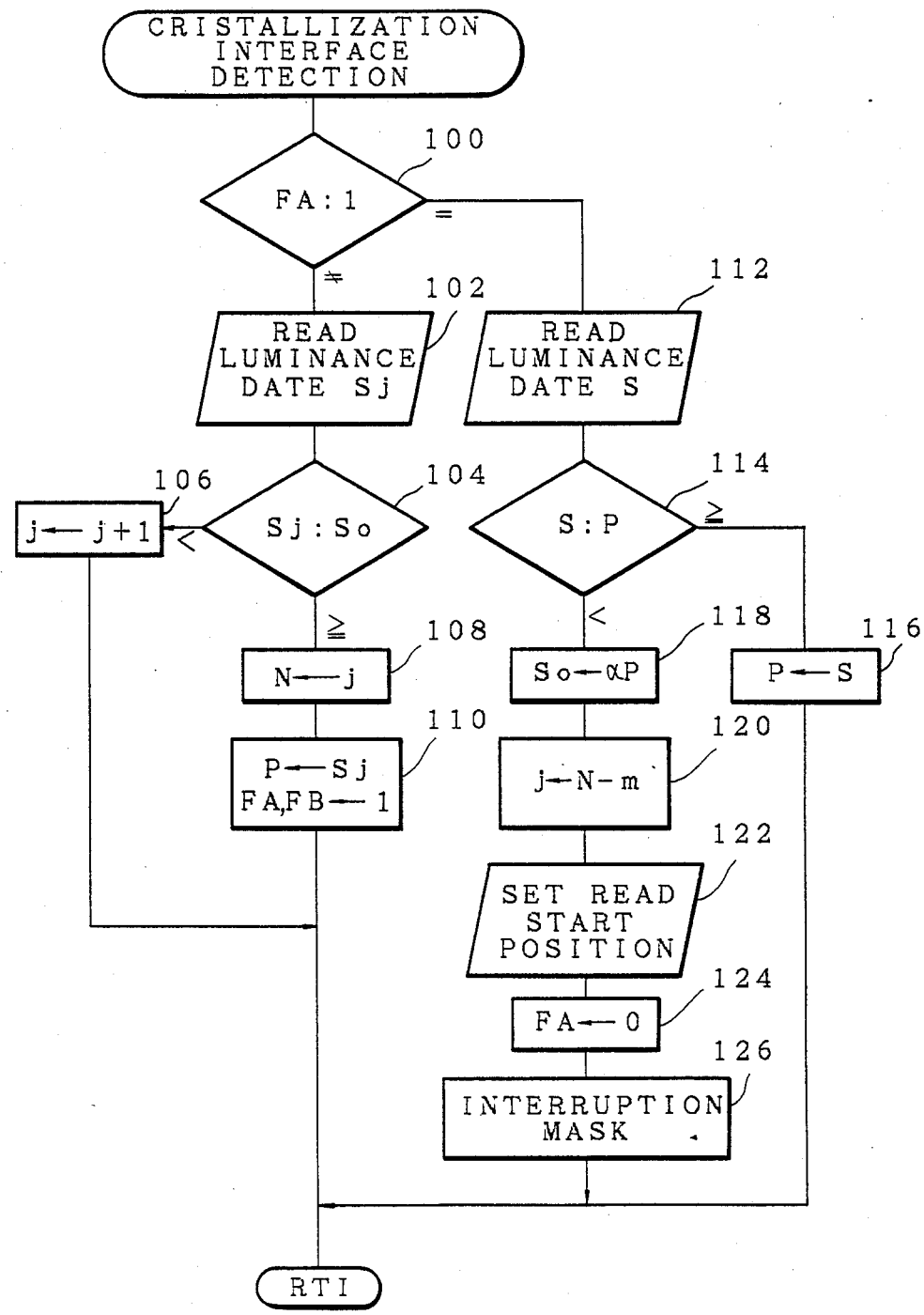

When interruption is effected by the output decision signal OV, the process shown in FIG. 3 is commenced.

First, in step 100, determination is made as to whether or not flag FA is set. The initial value of flag FA is 0. In step 102, the luminance data $S_j$ is read from the A/D converter 28. In step 104, the luminance data $S_j$ is compared with the reference value $S_o$. The initial value of the reference value $S_o$ is, for example, an empirical value or a value 1.5 times as greater than that of the luminance data $S_j$ read at the first time. A suffix j indicates a j-th scanning line from the uppermost position. The initial value of j is the same as the set value supplied from the microcomputer 30 to the matching discrimination circuit 34. At the first time, an empirical value is used as this initial value. If $S_j < S_o$, j is incremented, and the process returns to a step of a main routine (not shown) prior to the interruption.

Next, before transfer to the next scanning line, the horizontal synchronizing signal HSYNC is supplied from the AND gate 56 so as to effect interruption and start the process shown in FIG. 4.

In step 200, the melt diameter D is read from the counter 54. In step 202, the value of the melt diameter D is written in the RAM with an address A+i (address value written in address A−1) shown in FIG. 5. This address value (content of address A−1) is then incremented. Addresses A to A+10 serve as a storage area in which the melt diameter D is stored. Each time the process shown in FIG. 4 is performed, the content of the address A−1 is incremented, A+1 being followed by A. Thus, values of the melt diameter D are successively stored in addresses A to A+10 in a cyclic manner.

In step 204, determination is made as to whether flag FB is set or reset. The initial value of flag FB is 0. This process returns to a step of the main routine (not shown) prior to the interruption.

The above processes are repeated by the interruptions effected by the output decision signal OV and the horizontal synchronizing signal HSYNC. If thereafter $S_j \geq S_o$ is determined in step 104, that is, detection of the crystallization interface is recognized, the value of crystallization interface position N is set to j in step 108. In step 110, the value of the luminance data $S_j$ read in step 102 is set as a maximum peak value P, and both flags FA and FB are set. Then the process returns to the step prior to the interruption.

If interruption is effected by the front edge of HSYNC, steps 200 and 202 of FIG. 4 are executed. Next, FB=1 is determined in step 204, and the melt shoulder diameter Dm is detected in step 206. This detection is performed as described below. In step 202 the value of the melt diameter D is written in, for example, address A+9, the content of the preceding address A+8 is set as the melt shoulder diameter Dm. That is, the content of the address A+9 corresponds to the crystallizing-front crystal diameter Ds, and a value of the melt diameter D which is stored in the address A+8 and which corresponds to a horizontal scanning line 10 lines before the scanning line corresponding to the crystallizing end is set as the melt shoulder diameter Dm. If the content of the address A corresponds to the crystallizing-front crystal diameter Ds, the content of the address A+10 corresponds to the melt shoulder diameter Dm.

In step 208, flag FB is reset, and the process returns to the routine prior to the interruption.

Next, if interruption is effected by the output decision signal OV from the A/D converter 28, the process proceeds from step 100 to step 112, as shown in FIG. 3, so that the luminance data S is read from the A/D converter 28. In step 114, the value of the luminance data S and the maximum peak value P are compared. Is $S \geq P$, the value of the luminance data S is set as the maximum peak value P in step 116, and the process returns to the step prior to the interruption. If, after this interruption process has been repeated, $S < P$ is determined in step 114, a value which is obtained by multiplying by a (a: constant) the maximum peak value P representing a specific level of the luminance signal, that is, a value which is 70% of the maximum peak value P is set as the reference value $S_o$ in step 118.

The luminance of a portion of the melt in the vicinity of the deformed interface contour 22 is lower than that at the contour line itself of the deformed interface contour 22, but the temperature of this melt portion is substantially constant around the periphery thereof since this melt portion is rotated in unison with the monocrystalline rod 12. Therefore, if the sensing line L passes across the deformed interface contour 22, the luminance signal level changes up to the position corresponding to the maximum peak value from the position corresponding to the major crystallization interface, as shown in FIG. 7. However, since the luminance signal is read along the sensing line L from the side of the melt 16 to the side of the monocrystal rod 12, and the reference value $S_o$ is determined in the above-described manner, the position of the major crystallization interface 20 can be detected with consistent accuracy irrespective of whether or not the deformed interface contour 22 exists.

Next, in step 120, a value which is obtained by subtracting a constant value m, for example, 15 from the value of the scanning line position N corresponding to the major crystallization interface 20 is set as an initial value of j. In step 122, This value of j is output to the matching decision circuit 34 while latching this output. Flag FA is set in step 124, and the interruption is masked in step 126. This mask is canceled by a routine (not shown) when the front edge of the next vertical synchronizing signal VSYNC appears.

Thus, the luminance signal can be sampled from a place where there is no influence of light reflected on the lower surface of the induction heating coil 14, and which is higher than the position of the major crystallization interface 20.

The above-described device of the present invention can be modified in various ways. For instance, the industrial TV camera 18 used as the image-pickup means may be replaced with an image sensor or the like. In the above description, the reference value $S_o$ is set to a value obtained by multiplying by a the maximum peak value P determined at the preceding time. Otherwise, it may be determined as a value relative to a specific level of the luminance signal. For example, it may be obtained by multiplying by a certain value the luminance signal level obtained at the reading start position on the sensing line L.

What is claimed is:

1. A device for detecting the position of a crystallization interface, comprising:
   image-pickup means adapted to scan an area about a crystallization interface and output a luminance signal (S);
   luminance signal sampling means adapted to sample said luminance signal (S) from the side of a melt (16) to the side of a monocrystal rod (12) along a sensing line (L) intersecting said crystallization interface, thereby successively outputting a series of sampled luminance signals ($S_j$) relating to said sensing line, and determine pixel positions (j) of said sampled luminance signals ($S_j$) in correspondence with said sensing line (L);
   reference level determination means adapted to set a value as a reference level ($S_o$) relative to a specific level (P) of said sampled luminance signals ($S_j$);
   crystallization interface discrimination means adapted to discriminate said crystallization interface by comparing levels of said series of sampled luminance signals ($S_j$) with said reference level ($S_o$) and detecting a moment at which one of said levels of said sampled luminance signals ($S_j$) exceeds said reference level ($S_o$), said interface discrimination means recognizing said crystallization interface at said moment; and
   crystallization interface position determination means adapted to determine that one (k) of said pixel positions corresponding to said moment of discrimination of said crystallization interface is a pixel position corresponding to said crystallization interface.

2. A device for detecting the position of a crystallization interface according to claim 1, wherein said reference level determination means sets a value as a reference value ($S_o$) relative to a maximum peak value of said sampled luminance signals.

3. A device for detecting the position of a crystallization interface according to claim 1, wherein said reference level determination means sets a value as a reference value ($S_o$) relative to a luminance signal value obtained at a starting line of said sensing line.

4. A device for detecting the position of a crystallization interface according to claim 3, wherein said starting point of said sensing line is distanced from a previously detected position of said crystallization interface to the side of said melt to an extent corresponding to a predetermined number of horizontal scanning lines.

5. A device for detecting the position of a crystallization interface according to claim 1, wherein said sensing line is generally parallel to the center axis of said monocrystal rod.

* * * * *